United States Patent
Jeong

(10) Patent No.: US 6,297,097 B1
(45) Date of Patent: Oct. 2, 2001

(54) METHOD FOR FORMING A SEMICONDUCTOR MEMORY DEVICE WITH INCREASED COUPLING RATIO

(75) Inventor: Hee-Cheol Jeong, Chungcheongbuk-do (KR)

(73) Assignee: Hyundai Electronics Industries Co., Ltd., Kyoungki-Do (KR)

( * ) Notice: Subject to any disclaimer, the term of this patent is extended or adjusted under 35 U.S.C. 154(b) by 0 days.

(21) Appl. No.: 09/207,201

(22) Filed: Dec. 8, 1998

Related U.S. Application Data

(62) Division of application No. 08/789,529, filed on Jan. 27, 1997, now Pat. No. 5,886,379.

(30) Foreign Application Priority Data

May 16, 1996 (KR) .................................................. 96/16464

(51) Int. Cl.$^7$ .............................................. H01L 21/8247
(52) U.S. Cl. ........................................ 438/264; 438/594
(58) Field of Search .................................. 438/257–267, 438/593–594

(56) References Cited

U.S. PATENT DOCUMENTS

| | | | |
|---|---|---|---|
| 4,099,196 | 7/1978 | Simko | 257/317 |
| 4,590,504 | 5/1986 | Guterman | 257/321 |
| 4,618,876 | 10/1986 | Stewart et al. | 257/321 |
| 4,774,202 | * 9/1988 | Pan et al. | |
| 5,432,112 | * 7/1995 | Hong | |
| 5,640,032 | * 6/1997 | Tomioka | 257/316 |
| 5,646,059 | * 7/1997 | Sheu et al. | |
| 5,677,216 | * 10/1997 | Tseng | |
| 5,886,379 | * 3/1999 | Jeong | 257/319 |
| 5,915,177 | * 6/1999 | Tseng | 438/264 |
| 5,923,976 | * 7/1999 | Kim | 438/261 |
| 6,136,652 | * 10/2000 | Hazani | 438/260 |

\* cited by examiner

Primary Examiner—Richard Booth

(57) ABSTRACT

A semiconductor memory device and a method for manufacturing a semiconductor memory device for increasing the coupling ratio are disclosed. In the memory device, a tunneling insulating film is formed on a semiconductor substrate. A floating gate is formed on the tunneling insulating film. A dielectric layer is formed on the surface of the floating gate. A control gate having a predetermined shape is formed on the dielectric layer. The capacitance between the control gate and the floating gate is increased, enlarging the coupling ratio. As a result, the power consumption can be reduced and the access time can be decreased.

16 Claims, 9 Drawing Sheets

METHOD FOR FORMING A SEMICONDUCTOR MEMORY DEVICE WITH INCREASED COUPLING RATIO

This application is a division of Ser. No. 08/789,529 filed Jan. 27, 1997 now U.S. Pat. No. 5,886,379.

BACKGROUND OF THE INVENTION

The present invention relates to a method for manufacturing a semiconductor memory device, and more particularly, to an electrically erasable programmable read-only memory (EEPROM) device for increasing the coupling ratio.

Memory devices are largely divided into volatile memory devices in which stored information can be erased and new information can be stored, and non-volatile memory devices in which the stored information can generally be retained permanently.

As the volatile memory devices, there are random-access memories (RAMs) that allow information writing as well as information reading. As the non-volatile memory devices, there are read-only memories (ROMs), erasable programmable ROMs (EPROMs) and electrically erasable programmable ROMs (EEPROMs).

Among the non-volatile memory devices, the ROMs are devices in which programming cannot be performed again if information is stored therewith once. The EPROMs and EEPROMs are devices which can erase the stored information and be programmed again to store new information.

In the EPROMs and EEPROMs, the operation of programming an information is the same, but the methods for erasing the stored information are different from each other.

In other words, the EPROMs erase the stored information with ultraviolet (UV) light, while the EEPROMs erase the stored information electrically.

Among these memory devices, the EEPROMs will be described below.

A conventional EEPROM semiconductor memory device having an "ETOX" (EPROM Tunneling Oxide) will be described below with reference to the attached drawings.

FIGS. 1a to 1c are cross-sectional views illustrating a method for manufacturing a conventional EEPROM memory device. FIGS. 2a and 2b are schematic view illustrating operations for programming and erasing data in the conventional EEPROM memory device.

As shown in FIG. 1c, a floating gate 3a and a control gate 5a are stacked on a P-type silicon substrate 1. As a source region and a drain region, first and second impurity regions 7 and 8 are formed in the P-type silicon substrate 1 on both sides of the floating gate 3a.

Here, between the P-type silicon substrate 1 and the floating gate 3a, and between the floating gate 3a and the control gate 5a, insulating films are formed.

Between the floating gate 3a and the control gate 5a, an insulating film 4 is formed with a thickness corresponding to a gate insulating film of a general transistor. Between the floating gate 3a and the P-type silicon substrate 1, a thin tunnel oxide film 2 is formed.

A method for manufacturing such a conventional EEPROM device will be described below.

As shown in FIG. 1a, on a P-type silicon substrate 1, a tunnel oxide film 2, a first polysilicon 3, an insulating film 4 and a second polysilicon 5 are deposited sequentially.

As shown in FIG. 1b, a photoresist film 6 is deposited on the second polysilicon 5. Then, through exposure and development process, a control gate region and a floating gate region are defined.

As shown in FIG. 1c, using the defined photoresist film 6 as a mask, the second polysilicon 5, insulating film 4, first polysilicon 3 and tunnel oxide film 2 are selectively removed to form a control gate 5a and a floating gate 3a.

Then, using the control gate 5a and floating gate 3a as a mask, n-type impurity ions of high concentration are implanted into the P-type silicon substrate 1, thereby forming first and second impurity regions 7 and 8.

The operation of the conventional EEPROM device having the ETOX is as follows.

In order to write data into one cell, as shown in FIG. 2a, a voltage of 7~8V is applied to the second impurity region 8. A voltage pulse of 12~13V is applied to the control gate 5a, and the first impurity region 7 and P-type silicon substrate 1 are grounded. Then, a high energy is created from the PN junction formed between the n-type second impurity region 8 and the P-type silicon substrate 1, thereby causing a breakdown. Due to the breakdown, hot electrons are generated.

Some of the hot electrons have energy higher than the energy barrier height (about 2.3V) between the P-type silicon substrate 1 and the tunnel oxide film 2. Thus, some of the hot electrons are injected into the floating gate 3a from the P-type silicon substrate 1 through the tunnel oxide film 2, and stored therein. Such a method is called the channel hot electron injection method. This results in a cell having a logic "1" state in the binary system.

Referring to FIG. 2b, in order to erase the data written in the cell by the above described method, the P-type silicon substrate 1 and control gate 5a are grounded. A voltage pulse of 12~13V is applied to the first impurity region 7. Then, through the portion of the thin tunnel oxide film 2 where the floating gate 3a overlaps the first impurity region 7, the electrons are discharged from the floating gate 3a into the first impurity region 7 by Fowler-Nordheim tunneling. Fowler-Nordheim tunneling dominantly occurs when the thickness of a tunneling oxide (e.g. tunnel oxide film 2) is below about 4–5 nm and the applied voltage is high. Fowler-Nordheim tunneling allows the electrons to be injected into the conduction band of the tunneling oxide by tunneling and thus into the impurity region.

At this time, as the quantity of electrons discharging from the floating gate 3a is increased gradually, the threshold voltage of the cell becomes low gradually. In general, erasing of the stored data is carried out so that the threshold voltage of the cell is maintained at 3V or less.

Accordingly, a logic "0" state is provided in the binary system.

In the EEPROM device having the conventional ETOX, a random access is possible when reading a data. Thus, the time required for reading the data can be relatively short.

The EEPROM device having the conventional ETOX has the coupling ratio (KW) as follows. The coupling ratio represents a voltage in the floating gate induced by an external voltage applied to the control gate. Therefore, the greater the capacitance between the control gate and the floating gate, the greater the coupling ratio will be.

$$KW = \frac{C1}{C1 + C2 + C3 + C4}$$

Here, C1 represents the capacitance between the control gate 5a and the floating gate 3a, C2 represents the capacitance between the source and the floating gate 3a, C3 represents the capacitance between the substrate 1 and the floating gate 3a, and C4 represents the capacitance between the drain and the floating gate 3a. During erasing, the coupling ratio is as follows.

$$KW = 1 - \frac{C4}{C1 + C2 + C3 + C4}$$

Further, a program voltage Vp for the EEPROM is as follows.

$$Vp = \frac{Qfg}{Cr} + \frac{VcgC1 + VbC4 + VsubC3 + VsC2}{Cr}$$

Here, Qfg represents the charge of the floating gate 3a, Cr=C1+C2+C3+C4,

Vcg represents the control gate voltage,

Vb represents the drain voltage,

Vsub represents the substrate voltage, and

Vs represents the source voltage.

According to the above equations, it is desirable to have a high coupling ratio so that effective programming can be carried out. To obtain the high coupling ratio, the capacitance between the control gate and the floating gate should be increased. By increasing the cell size, the capacitance between the control gate and the floating gate can be increased. But, increasing the cell size causes a great difficulty in high density device packing.

Therefore, in the conventional EEPROMs, a high voltage must be applied to the drain in an attempt to compensate for the low coupling ratio. As a result, the conventional EEPROMs have problems in that they consume high power and are less reliable for effective programming.

SUMMARY OF THE INVENTION

In order to solve the aforementioned and other problems, the present invention provides a semiconductor memory device and a method for manufacturing the same, in which the coupling ratio for a floating gate and a control gate is increased so that writing is possible even if a low voltage is applied to the drain/source.

In accordance with the present invention a semiconductor memory device includes a semiconductor substrate, a tunneling insulating film formed on the semiconductor substrate, a floating gate formed on the tunneling insulating film and having a bent on one side thereof, a dielectric layer formed on the surface of the floating gate, a control gate formed on the dielectric layer, and first and second impurity regions formed in the substrate on both sides of the floating gate.

Further, in accordance with the present invention a method for manufacturing a semiconductor memory device including the steps of preparing a semiconductor substrate; sequentially forming a tunneling insulating film, a first conductor layer, and an insulating film; selectively removing the tunneling insulating film to form a contact hole; forming a second conductor layer on the entire surface so that the second conductor layer is connected to the first conductor layer through the contact hole; defining a unit cell region by centering around the contact hole to selectively remove the second and first conductor layers and to remove the insulating film to form a floating gate; forming a dielectric layer on the exposed surface of the floating gate; forming a control gate on the dielectric layer; and forming first and second impurity regions in the semiconductor substrate on both sides of the floating gate.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

Briefly described, the present invention is directed to a semiconductor memory device including a semiconductor substrate, a tunneling film formed on the semiconductor substrate, first and second gates formed on the tunneling film, a dielectric layer formed between the first and second gates, and first and second impurity regions formed in the semiconductor substrate adjacent the tunneling film, wherein one of the first gate and the second gate has a projecting portion.

Further, the present invention is directed to a semiconductor memory device including a semiconductor substrate, a tunneling insulating film formed on the semiconductor substrate, a first gate formed on the tunneling insulating film and having a substantially jar shape, a second gate formed on the tunneling insulating film and having a substantially I-shape, a dielectric layer formed between the first and second gates, and first and second impurity regions formed in the semiconductor substrate adjacent the first gate.

The present invention is also directed to a method for manufacturing a semiconductor memory device, including the steps of forming a tunneling film and a first conductor layer on a semiconductor substrate; forming a second conductor layer connected to the first conductor through a contact hole so as to form a floating gate; forming a dielectric layer on the floating gate; forming a control gate on the dielectric layer; and forming first and second impurity regions in the semiconductor substrate adjacent the floating gate.

The present invention is further directed to a method for manufacturing a semiconductor memory device, including the steps of forming a tunneling insulating film and a first conductor layer on a semiconductor substrate; forming a second conductor layer having a contact hole therethrough on the first conductor layer so as to form a floating gate; forming a dielectric layer on a surface of the floating gate; forming a control gate on the dielectric layer; and forming first and second impurity regions in the semiconductor substrate adjacent the floating gate.

BRIEF DESCRIPTION OF THE ATTACHED DRAWINGS

The present invention will become more fully understood from the detailed description given hereinbelow and the accompanying drawings which are given by way of illustration only, and, thus, are not limitative of the present invention, and wherein.

DETAILED DESCRIPTION OF THE PREFERRED EMBODIMENTS

Hereinafter, a semiconductor memory device and a method for manufacturing the same according to the present invention will be described with reference to the attached drawings.

FIGS. 3a to 3j are cross-sectional views for illustrating a method for manufacturing an EEPROM device according to a first embodiment of the present invention.

Figure 1A:
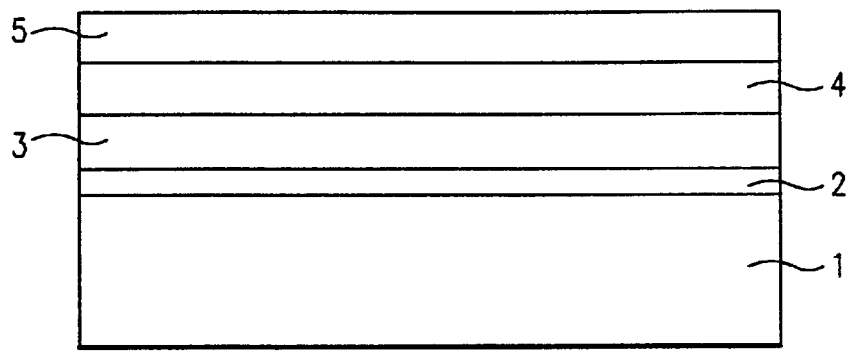
FIGS. 1a to 1c are cross-sectional views illustrating a method for manufacturing a conventional flash memory device.
Figure 1B:
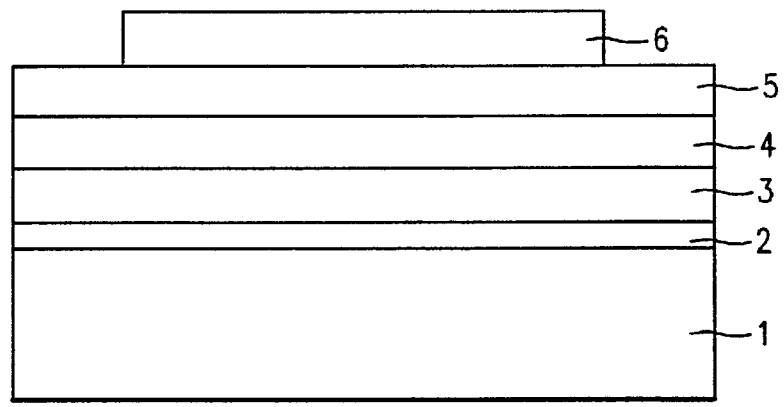
Figure 1C:
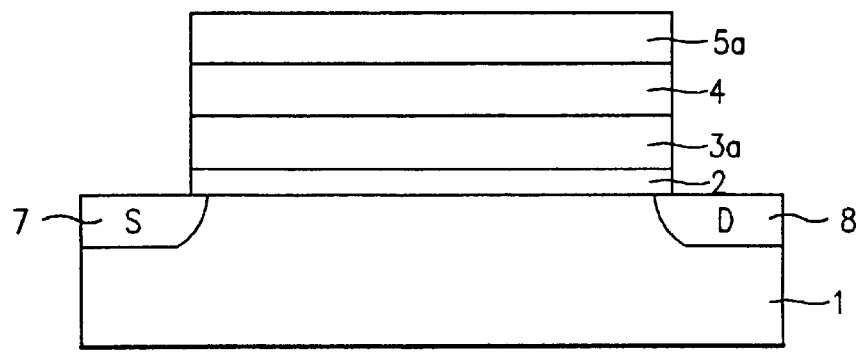
Figure 2A:
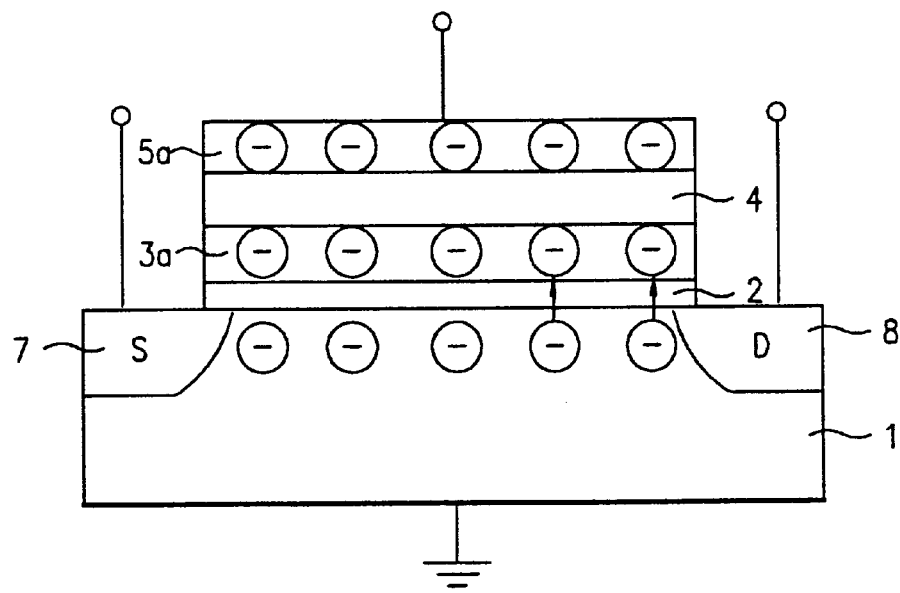
FIGS. 2a and 2b are schematic views for illustrating operations for writing and erasing data in the conventional flash memory device.
Figure 2B:
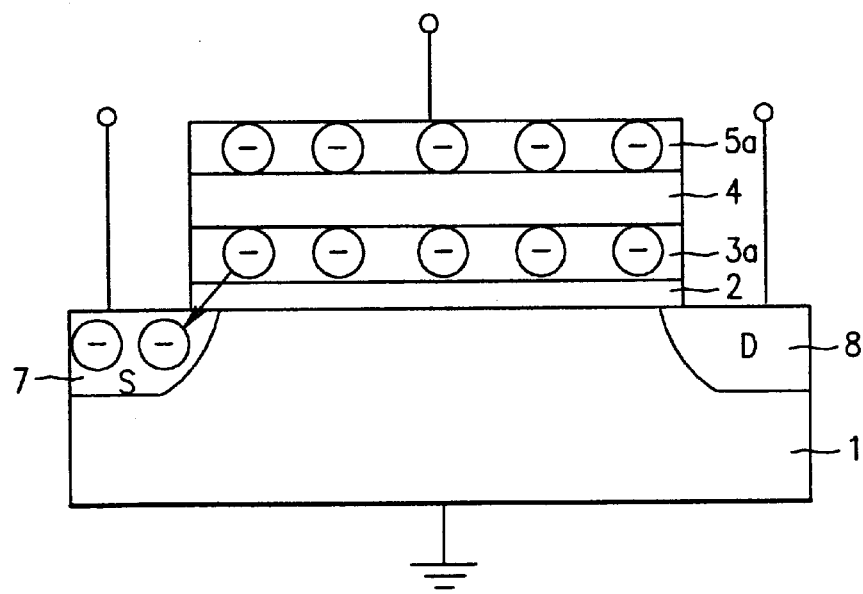
Figure 3A:
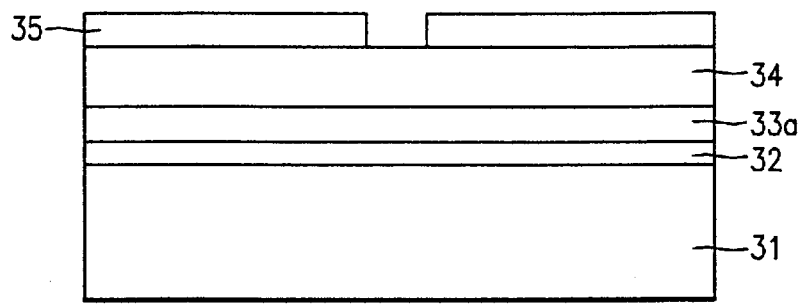
FIGS. 3a to 3j are cross-sectional views for illustrating a method for manufacturing an EEPROM device, according to a first embodiment of the present invention.

As shown in FIG. 3a, a thin tunnel oxide film 32, a first polysilicon layer 33a and a nitride film 34 are sequentially deposited on a semiconductor substrate 31.

A first photoresist film 35 is deposited on the nitride film 34. Then, the first photoresist film 35 is exposed and developed to thereby expose a predetermined portion of the nitride film 34.

Figure 3B:
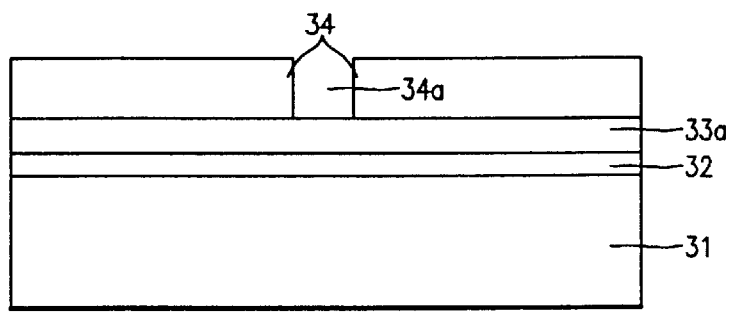

As shown in FIG. 3b, using the first photoresist film 35 as a mask, the exposed nitride film 34 is selectively removed to form a contact hole 34a through the nitride film 34. The first photoresist film 35 is removed.

Figure 3C:
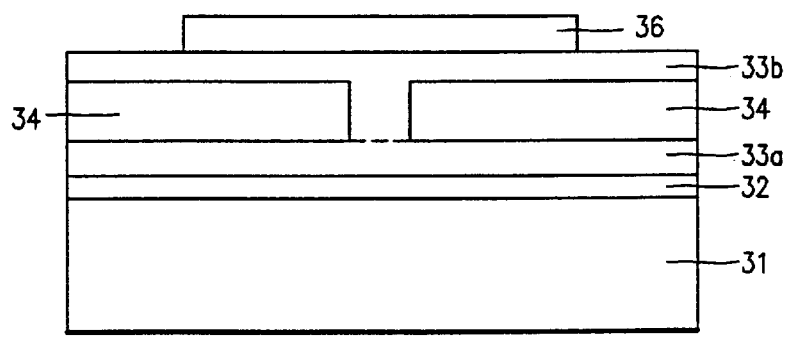

As shown in FIG. 3c, a second polysilicon layer 33b is deposited on the entire surface so that the first and second polysilicon layers 33a and 33b are connected through the contact hole 34a. After depositing a second photoresist film 36 on the second polysilicon layer 33b, the second photoresist film 36 is exposed and developed to define a unit cell region.

Figure 3D:
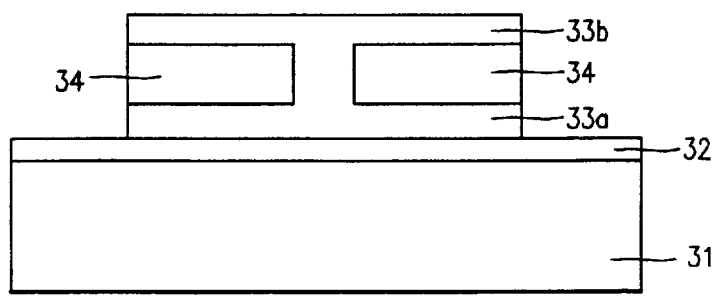

As shown in FIG. 3d, using the patterned second photoresist film 36 as a mask, the first and second polysilicon layers 33a and 33b and the nitride film 34 are etched selectively. Then the second photoresist film 36 is removed.

Figure 3E:
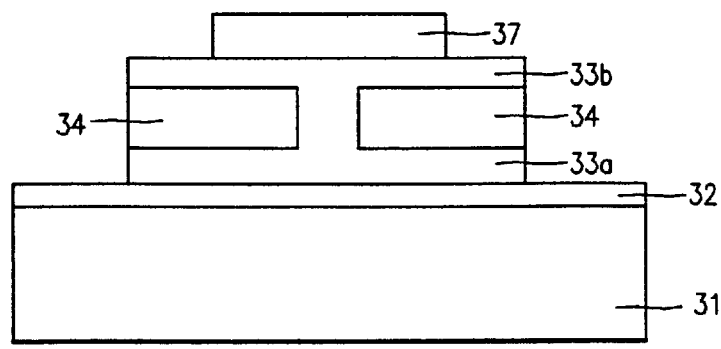

As shown in FIG. 3e, after depositing a third photoresist film 37 on the second polysilicon layer 33b, the third photoresist film 37 is exposed and developed to thereby form a third photoresist film 37 pattern.

At this time, the third photoresist film 37 pattern is formed to have a width narrower than that of the pattern of second photoresist film 36.

Figure 3F:
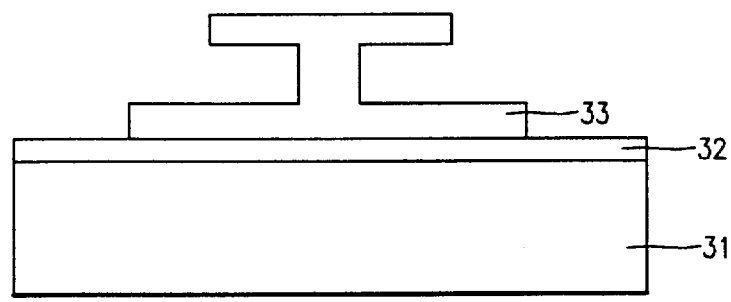

As shown in FIG. 3f, using the third photoresist film 37 pattern as a mask, the exposed second polysilicon layer 33b is selectively removed and the nitride film 34 is completely removed, thereby forming a floating gate 33 having a predetermined shape.

Figure 3G:
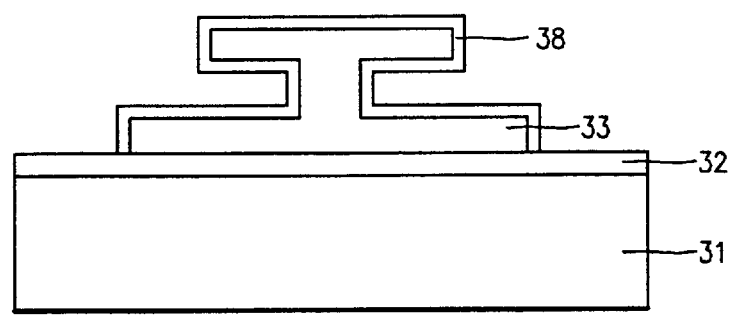

As shown in FIG. 3g, a high temperature and low pressure dielectric (HLD) layer 38 is formed over the exposed surface of floating gate 33.

Figure 3H:
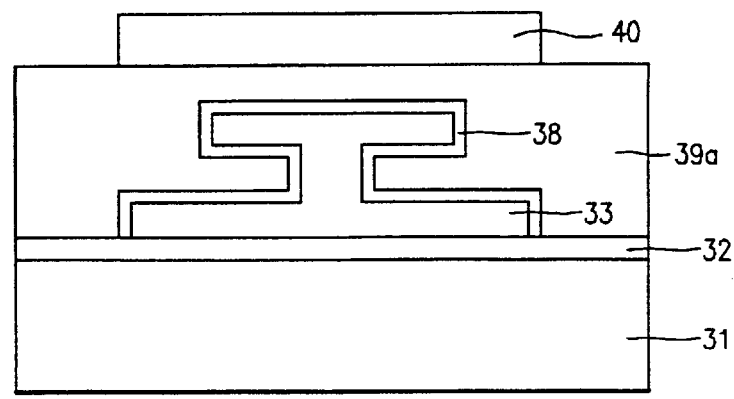

As shown in FIG. 3h, a third polysilicon layer 39a is deposited on the entire surface of tunnel oxide film 32 and over the high temperature and low pressure dielectric (HLD) layer 38.

After depositing a fourth photoresist film 40 on the third polysilicon layer 39a, the fourth photoresist film 40 is exposed and developed to define a unit cell region having the size same as the patterned second photoresist film 36. For example, the width of the fourth photoresist film 40 is same as the width of the patterned second photoresist film 36.

Figure 3I:
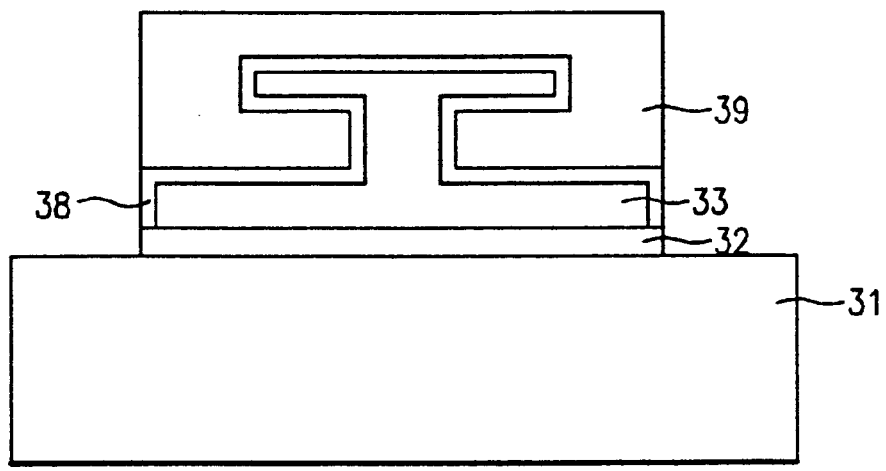

As shown in FIG. 3i, using the patterned fourth photoresist film 40 as a mask, the exposed third polysilicon layer 39a and tunnel oxide film 32 are selectively etched to form a control gate 39 having a predetermined shape embracing the shape of the floating gate 33.

Figure 3J:
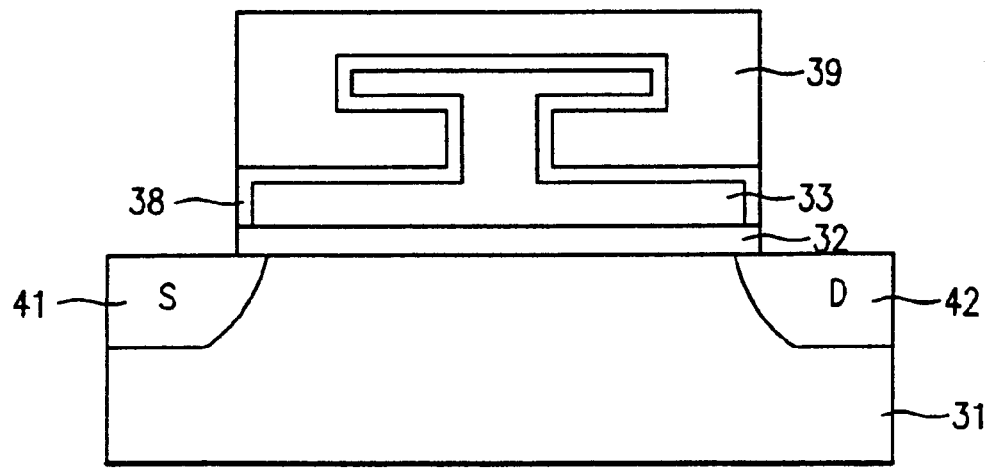

As shown in FIG. 3j, using the control gate 39 and floating gate 33 as a mask, n-type impurity ions of high concentration are implanted into the substrate 31 to form first and second impurity regions 41 and 42 as source and drain regions. Here, although the first impurity region 41 is shown as the source region, it can also be designated as the drain region. As a result, an EEPROM device having an increased contact area between the control gate and the floating gate is formed. The increased contact area increases the capacitance between the control gate and floating gate and thus the coupling ratio is increased without increasing the cell size.

Meanwhile, FIGS. 4a to 4h are cross-sectional views for illustrating a method for manufacturing an EEPROM device, according to a second embodiment of the present invention.

Figure 4A:
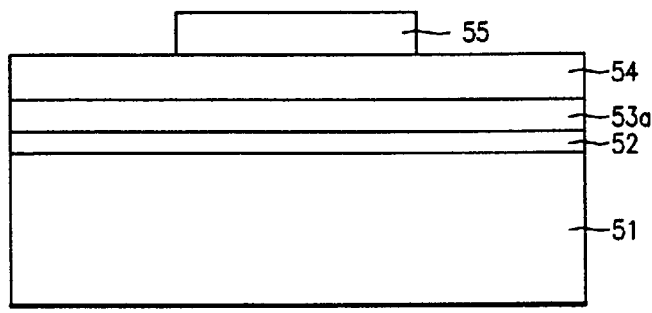
FIGS. 4a to 4h are cross-sectional views for illustrating a method for manufacturing an EEPROM device, according to a second embodiment of the present invention.

As shown in FIG. 4a, a thin tunnel oxide film 52, a first polysilicon layer 53a and a nitride film 54 are sequentially deposited on a semiconductor substrate 51.

A first photoresist film 55 is deposited on the nitride film 54. The first photoresist film 55 is exposed and developed to thereby expose predetermined portions of the nitride film 54.

Figure 4B:
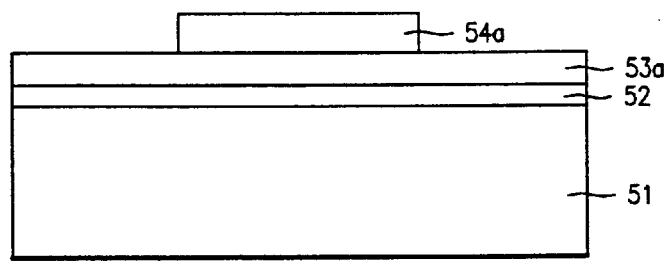

As shown in FIG. 4b, using the patterned first photoresist film 55 as a mask, the exposed nitride film 54 is selectively removed to form a nitride film pattern 54a. Then the first photoresist film 55 is removed.

Figure 4C:
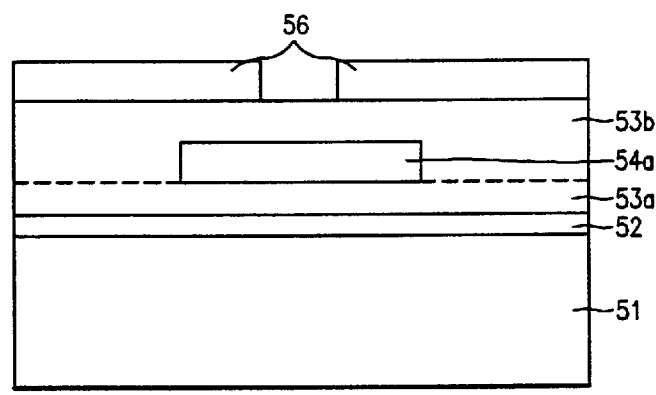

As shown in FIG. 4c, a second polysilicon layer 53b is deposited on the first polysilicon layer 53a and the nitride film pattern 54a so that the first and second polysilicon layers 53a and 53b are directly connected to each other. After depositing a second photoresist film 56 on the second polysilicon layer 53b, the second photoresist film 56 is exposed and developed to form a pattern which exposes a portion of the second polysilicon layer 53b.

Figure 4D:
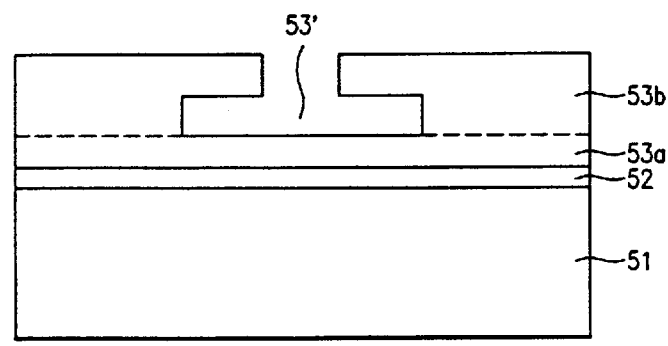

As shown in FIG. 4d, using the second photoresist film 56 pattern as a mask, the exposed second polysilicon layer 53b is selectively removed and all of the nitride film pattern 54a is removed. Then the second photoresist film 56 is removed. As a result, a hole region 53' is formed in the middle of the polysilicon layers 53a and 53b.

Figure 4E:
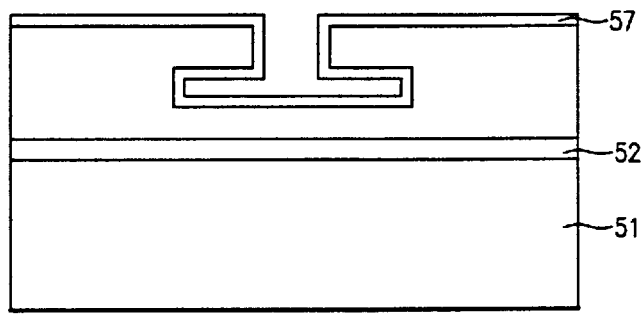

As shown in FIG. 4e, a high temperature and low pressure dielectric (HLD) layer 57 is formed on the exposed surface of first and second polysilicon layers 53a and 53b including the hole region 53'.

Figure 4F:
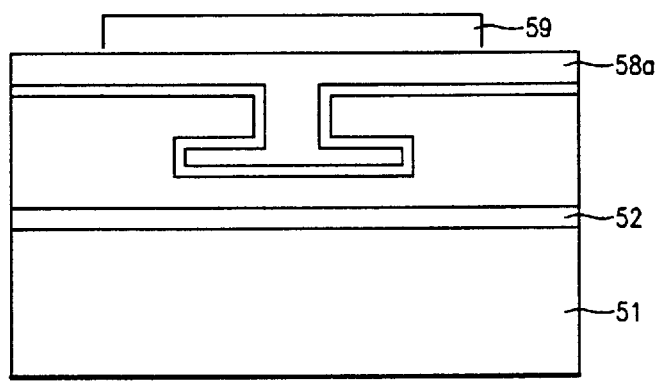

As shown in FIG. 4f, a third polysilicon layer 58a is deposited on the entire surface of high temperature and low pressure dielectric (HLD) layer 57. After depositing a third photoresist film 59 on the entire third polysilicon layer 58a, the third photoresist film 59 is exposed and developed to thereby define a unit cell region.

Figure 4G:
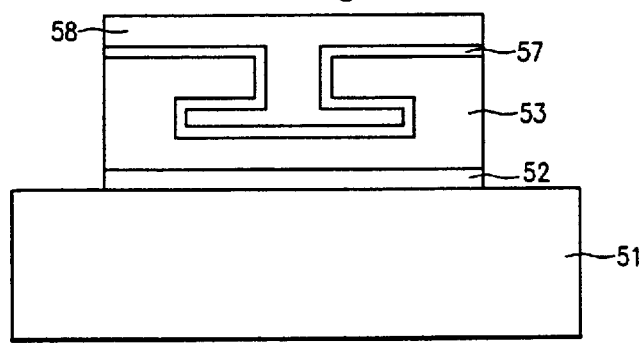

As shown in FIG. 4g, using the patterned third photoresist film 59 as a mask, the first, second and third polysilicon layers 53a, 53b and 58a, the high temperature and low pressure dielectric (HDL) layer 57 and the tunnel oxide film 52 are selectively removed to form a control gate 58 and a floating gate 53.

Figure 4H:
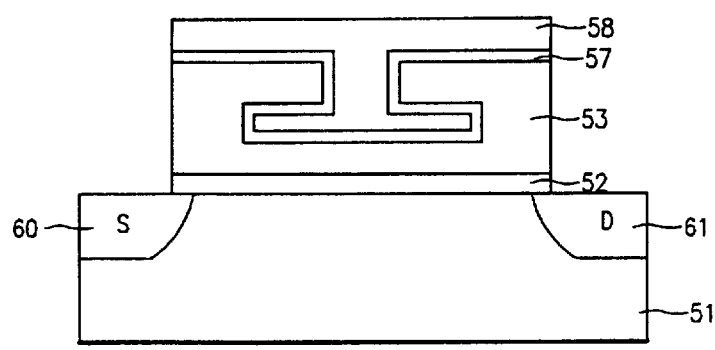

As shown in FIG. 4h, using the control gate 58 and the floating gate 53 as a mask, n-type impurity ions of high concentration are implanted into the substrate 51 to form first and second impurity regions 60 and 61 as source and drain regions. Although the first impurity region 60 is shown as the source region, it is possible to have the first impurity region 60 as the drain region. As a result, a semiconductor memory device having an increased contact area and an increased coupling ratio is formed.

FIGS. 5*a* and 5*b* and FIGS. 6*a* and 6*b* are cross-sectional views of a unit cell of a memory device of the present invention for illustrating operational principles of the present invention.

Figure 5A:
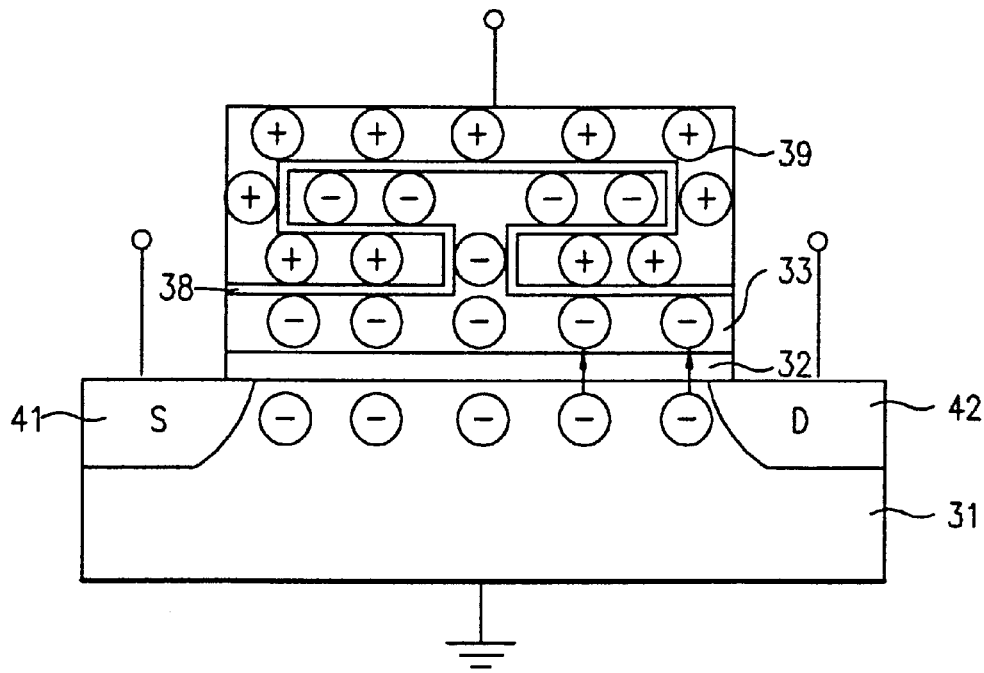
FIGS. 5a and 5b are schematic views for illustrating operations for writing and erasing data in the first embodiment of the present invention.
Figure 5B:
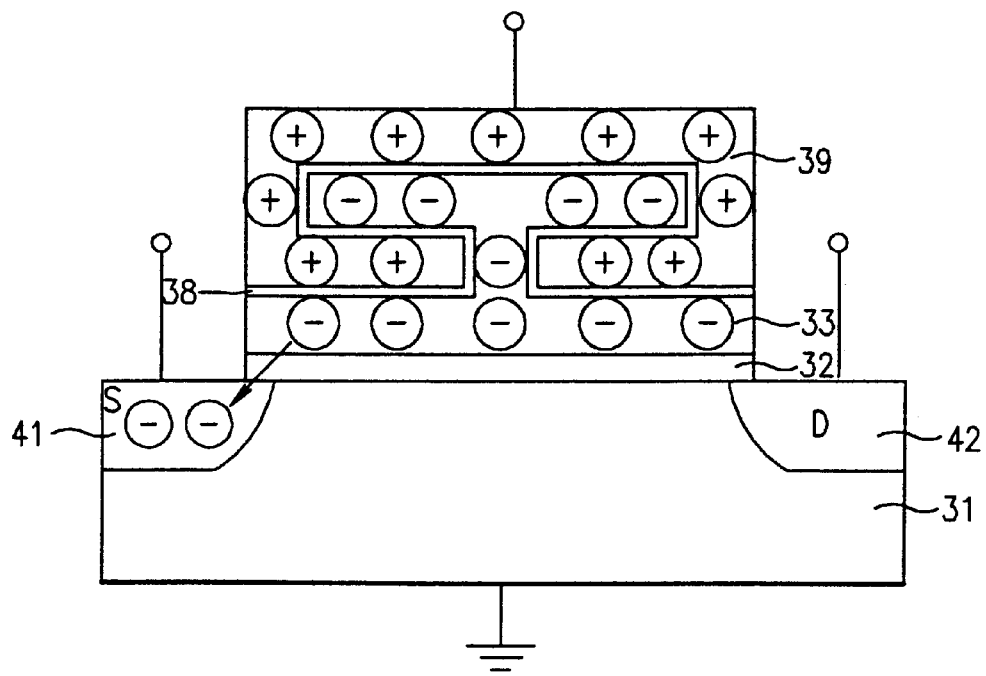

In the semiconductor memory device according to the first embodiment of the present invention, as shown in FIGS. 5*a* and 5*b*, the tunnel oxide film 32 is formed on a predetermined portion of the semiconductor substrate 31 overlapping portions of the impurity regions 41 and 42. The floating gate 33 is formed with an "I" shape on the tunnel oxide film 32. The dielectric layer 38 is formed on surfaces of the floating gate 33.

The control gate 39 having an "inverse jar" shape is formed on the dielectric layer 38. The first and second impurity regions 41 and 42 of source/drain regions are formed in the semiconductor substrate 31 on both sides of the floating gate 33 and control gate 39.

The floating gate 33 has a structure which can be divided into three floating gates. That is, the first floating gate is formed on the tunnel oxide film 32, the second floating gate is formed on the center of the first floating gate, and the third floating gate is formed so that its center is connected to the second floating gate. The third floating gate is positioned parallel to the first floating gate. The first, second and third floating gates of the gate 33 are electrically connected to one another.

The control gate 39 is formed on the dielectric layer 38 and partially surrounds the floating gate 33. Further, the floating gate 33 overlaps the first and second impurity regions 41 and 42 at the edges thereof.

Figure 6A:
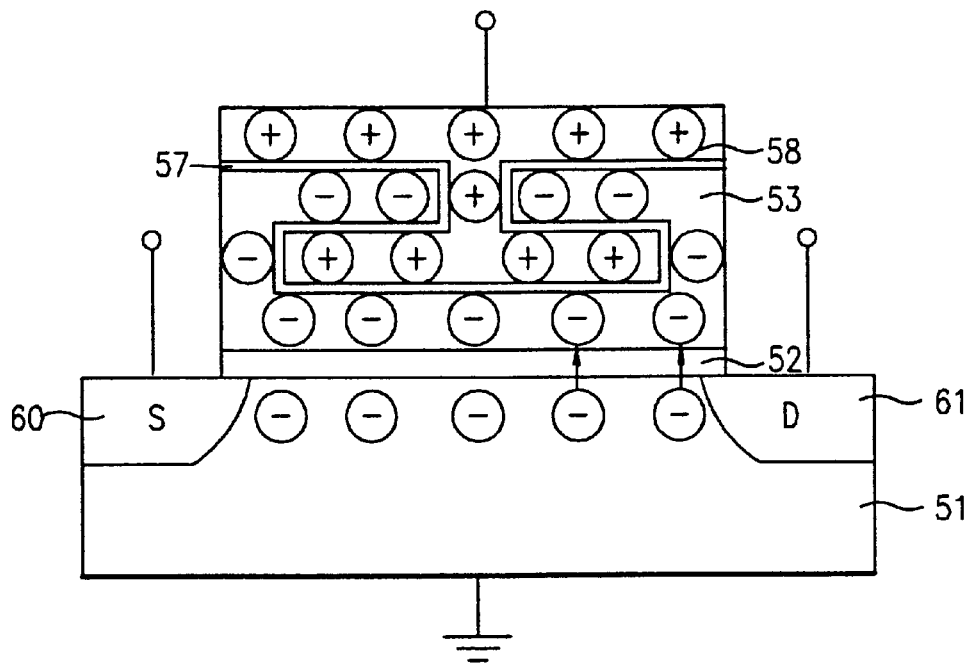
FIGS. 6a and 6b are schematic views for illustrating operations for writing and erasing data in the second embodiment of the present invention.
Figure 6B:
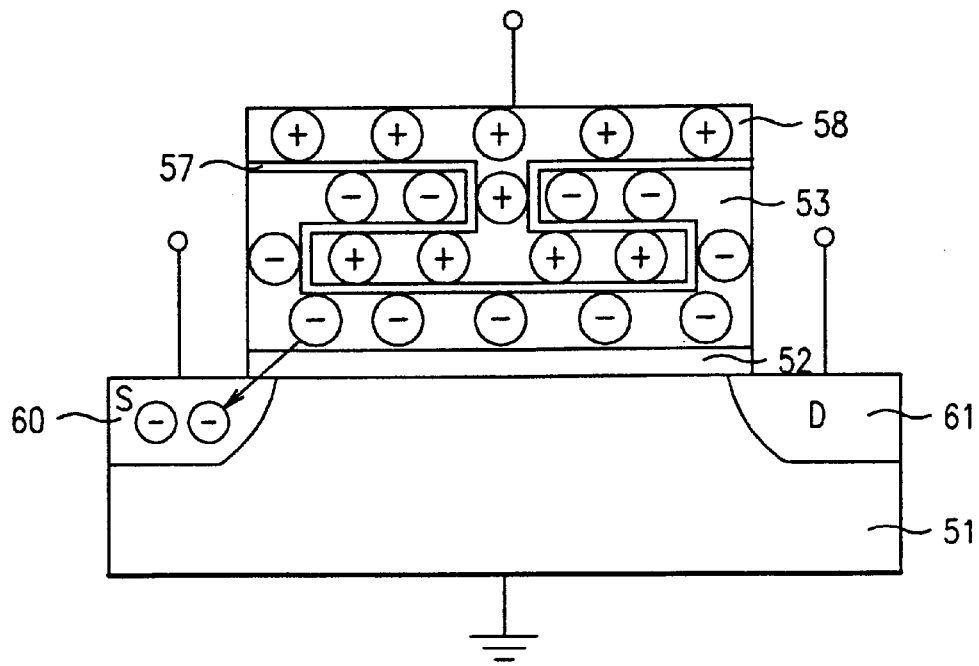

Meanwhile, in the semiconductor memory device according to the second embodiment of the present invention, as shown in FIGS. 6*a* and 6*b*, the tunnel oxide film 52 is formed on a predetermined portion of the semiconductor substrate 51. The floating gate 53 has the shape of a "jar" and is formed on the tunnel oxide film 52. The dielectric layer 57 is formed on the surfaces of floating gate 53.

The control gate 58 having an "I" shape is formed on the dielectric layer 57. The first and second impurity regions 60 and 61 of source/drain regions are formed in the semiconductor substrate 51 on both sides of the floating gate 53 and control gate 58.

The floating gate 53 can be divided into a plurality of floating gates. That is, the first floating gate of the gate 53 is formed on the tunnel oxide film 52. The second and third floating gates are formed on the upper side of the ends of the first floating gate, respectively, so that the second and third floating gates are connected to the first floating gate. On the second floating gate, the fourth floating gate is formed such that one side of the fourth floating gate is connected to the second floating gate and the other side thereof extends towards the fifth floating gate, parallel to the first floating gate. On the third floating gate, the fifth floating gate is formed such that one side of the fifth floating gate is connected to the third floating gate and the other side thereof extends toward the fourth floating gate, parallel to the first floating gate. The fifth floating gate does not directly contact the fourth floating gate. The first through fifth floating gates together as a whole define a "jar" shape of the floating gate 53.

The control gate 58 has the following structure and can be divided into first through third control gates. The first control gate is formed on the dielectric layer 57 so as to fill a space region defined by the first, second, third, fourth and fifth floating gates. The second control gate is formed between the fourth and fifth floating gates and extends from the center of the first control gate. The third control gate is formed over the upper sides of the fourth and fifth floating gates and on the second control gate so as to be connected with the second control gate. The first through third control gates together as a whole define an "I" shape of control gate 58.

The operation method of the semiconductor memory device constructed according to the first and second embodiments of the present invention is described below.

In order to write a data into one cell of the memory device, as shown in FIG. 5*a* and FIG. 6*a*, a proper voltage of $V_{CG}$>Vp is applied to the control gates 39 and 58. The first impurity regions 41 and 60 and the substrates 31 and 51 are grounded. A voltage of $V_D{\neq}0$ is applied to the second impurity regions 42 and 61.

At this time, the voltage applied to the control gates 39 and 58 and the voltage applied to the second impurity regions 42 and 61 are lower than those of the prior art.

Then, hot electrons are generated between the second impurity regions 42 and 61 and the substrates 31 and 51. Some of the hot electrons are injected into the floating gates 33 and 53 from the substrates 31 and 51 through the tunnel oxide films 32 and 52, and are stored therein. As a result, the writing operation is completed without applying high external voltages.

In order to erase the data written in one cell by the above described method, the substrates 31 and 51 and the control gates 39 and 58 are grounded, as shown in FIGS. 5*b* and 6*b*. With the second impurity regions 42 and 61 in floating states, a pulse voltage V is applied to the first impurity regions 41 and 60.

At this time, the pulse voltage V applied to the first impurity regions 41 and 60 is lower than that of the prior art.

Then, through the portion of the tunnel oxide films 32 and 52 where the floating gates 33 and 53 overlap the first impurity regions 41 and 60, respectively, the electrons stored in the floating gates 33 and 53 are respectively discharged into the first impurity regions 41 and 60 by Fowler-Nordheim tunneling.

At this time, as the quantity of electrons discharging from floating gates 33 and 53 is gradually increased, the threshold voltage of the cell becomes low gradually. In general, erasing is carried out so as to maintain the threshold voltage of the cell at or less than 3V.

As described above, the semiconductor memory device of the present invention offers the following advantages.

First, the capacitance between the floating gate and the control gate is increased, enlarging the coupling ratio. Thus, the efficiency of writing is improved.

Second, since the coupling ratio is increased, the voltage applied to the control gate and the first and second impurity regions during writing/erasing can be decreased. Thus, power consumption is reduced.

Third, since the coupling ratio is increased, in case that the same gate voltage is applied, the read current is increased to thereby decrease the access time.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for manufacturing a semiconductor memory device, comprising the steps of:
   forming a tunneling film and a first conductor layer on a semiconductor substrate;
   forming a second conductor layer connected to the first conductor layer so as to form a floating gate;
   forming a dielectric layer on the floating gate;
   forming a control gate on the dielectric layer; and
   forming first and second impurity regions in the semiconductor substrate adjacent the floating gate, such that the first and second conductor layers are connected together overlying a portion of the semiconductor substrate between the first and second impurity regions.

2. A method for manufacturing a semiconductor memory device as claimed in claim 1, wherein said step of forming the tunneling film and the first conductor layer includes the steps of:
   forming a first conductive film on the tunneling film,
   forming an insulating film on the first conductive film, and
   forming a contact hole in the insulating film.

3. A method for manufacturing a semiconductor memory device as claimed in claim 2, wherein said step of forming the second conductor layer includes the step of:
   forming a second conductive film in the contact hole and on the insulating film.

4. A method for manufacturing a semiconductor memory device as claimed in claim 3, wherein said step of forming the first conductor layer includes the step of:
   selectively removing the first conductive film, the insulating film, and the second conductive film so as to define a unit cell region.

5. A method for manufacturing a semiconductor memory device as claimed in claim 4, wherein said step of forming the second conductor layer includes the step of:
   removing the insulating film and portions of the second conductive film to form the floating gate.

6. A method for manufacturing a semiconductor memory device as claimed in claim 1, wherein the length of the second conductor layer is shorter than the length of the first conductor layer.

7. A method for manufacturing a semiconductor memory device as claimed in claim 2, wherein the insulating film is comprised of a nitride film.

8. A method for manufacturing a semiconductor memory device as claimed in claim 1, wherein the first and second conductor layers and the control gate are comprised of polysilicon.

9. A method for manufacturing a semiconductor memory device, comprising the steps of:
   forming a tunneling film and a first conductor layer on a semiconductor substrate;
   forming a second conductor layer having a contact hole therethrough on the first conductor layer so as to form a floating gate;
   forming a dielectric layer on a surface of the floating gate;
   forming a control gate on the dielectric layer; and
   forming first and second impurity regions in the semiconductor substrate adjacent the floating gate, such that the contact hole is overlying a portion of the semiconductor substrate between the first and second impurity regions.

10. A method for manufacturing a semiconductor memory device as claimed in claim 9, wherein said step of forming the second conductor layer includes the steps of:
    forming an insulating film on the first conductor,
    forming a conductive film on the first conductor and the insulating film,
    selectively removing the conductive film so as to expose a predetermined portion of the insulating film, and
    removing the insulating film completely to form the contact hole.

11. A method for manufacturing a semiconductor memory device as claimed in claim 9, wherein the second conductor includes:
    a first portion being substantially parallel to the tunneling film,
    a second portion projecting from the first portion, and
    a third portion connected to the second portion and being substantially parallel to the first portion.

12. A method for manufacturing a semiconductor memory device as claimed in claim 11, wherein the length of the third portion is shorter than the length of the first portion.

13. A method for manufacturing a semiconductor memory device as claimed in claim 11, wherein the second and third portions fill the contact hole.

14. A method for manufacturing a semiconductor memory device as claimed in claim 9, wherein the first and second conductor layers and the control gate are comprised of polysilicon.

15. A method for manufacturing a semiconductor memory device comprising:
    forming a tunnel oxide on a substrate;
    forming a floating gate above the tunnel oxide, the floating gate having at least one protrusion;
    forming a dielectric layer to cover surfaces of the floating gate;
    forming a control gate on the dielectric layer, the control gate having at least one protrusion; and
    forming impurity regions in the substrate, the impurity regions being electrically connected with the floating gate,
    wherein the control gate surrounds the protrusion of the floating gate.

16. A method for manufacturing a semiconductor memory device comprising:
    forming a tunnel oxide on a substrate;
    forming a floating gate above the tunnel oxide, the floating gate having at least one protrusion;
    forming a dielectric layer to cover surfaces of the floating gate;
    forming a control gate on the dielectric layer, the control gate having at least one protrusion; and
    forming impurity regions in the substrate, the impurity regions being electrically connected with the floating gate,
    wherein the floating gate surrounds the protrusion of the control gate.

* * * * *